United States Patent
Shchur et al.

(10) Patent No.: US 10,282,030 B2
(45) Date of Patent: May 7, 2019

(54) WEARABLE DEVICE AND METHOD OF OPERATING THE SAME

(71) Applicant: Samsung Electronics Co., Ltd, Gyeonggi-do (KR)

(72) Inventors: Oleksandr Shchur, Kiyv (UA); Sun-kyung Kim, Busan (KR); Aleksandra Peteichuk, Tiachivskyi region (UA); Andriy Oliynyk, Kyiv (UA); Oleksandr Radomskyi, Kharkiv (UA); Yevgen Yakishyn, Kiyv (UA)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/703,771

(22) Filed: Sep. 13, 2017

(65) Prior Publication Data

US 2018/0074650 A1 Mar. 15, 2018

(30) Foreign Application Priority Data

Sep. 13, 2016 (KR) .................. 10-2016-0118299

(51) Int. Cl.
*H01T 19/04* (2006.01)
*G06F 3/041* (2006.01)
(Continued)

(52) U.S. Cl.
CPC ......... *G06F 3/0418* (2013.01); *G01R 19/175* (2013.01); *G01R 29/12* (2013.01);
(Continued)

(58) Field of Classification Search
CPC .... G01R 19/175; G01R 29/12; G01R 31/025; G01R 19/2509; G06F 1/163; G06F 3/0418; G06F 3/044; H01T 19/04; H01L 41/113
See application file for complete search history.

(56) References Cited

U.S. PATENT DOCUMENTS 6,353,324 B1 * 3/2002 Uber, III ............ G01R 19/2509
324/457
8,380,130 B2 2/2013 Glass et al.
(Continued)

FOREIGN PATENT DOCUMENTS

WO 2015/094220 A1 6/2015
WO 2015138688 A1 9/2015

OTHER PUBLICATIONS

Adiyan Mujibiya, Corona: Interactivity of Body Electrostatics in Mobile Scenarios Using Wearable High-Voltage Static Charger, Aug. 24-27, 2015, Mobile HCI 2015, pp. 435-444.*
ISA/KR, "International Search Report," International Application No. PCT/KR2017/009980, dated Jan. 16, 2018, 13 pages.
Xianjie Chen et al., "Articulated Pose Estimation by a Graphical Model with Image Dependent Pairwise Relations", 2014, 9 pages.
(Continued)

*Primary Examiner* — Richard J Hong

(57) ABSTRACT

A wearable device includes a first electrode configured to contact a user's body; a second electrode having a pointed shape, in which corona discharge occurs; a power supplier connected between the first electrode and the second electrode to apply power to the first electrode and the second electrode; a current measurer configured to measure a leakage current that leaks to the second electrode; and a controller configured to control the power supplier to apply power to the first electrode and the second electrode to induce the corona discharge, measure a leakage current generated due to the corona discharge via the current measurer, and sense the touch event, based on the measured leakage current.

16 Claims, 8 Drawing Sheets

(51) Int. Cl.
    *G01R 19/175* (2006.01)
    *G01R 29/12* (2006.01)
    *G06F 1/16* (2006.01)
    *G06F 3/044* (2006.01)
    *G01R 31/02* (2006.01)

(52) U.S. Cl.
    CPC .............. *G06F 1/163* (2013.01); *G06F 3/044* (2013.01); *H01T 19/04* (2013.01); *G01R 31/025* (2013.01)

(56) References Cited

U.S. PATENT DOCUMENTS

| | | |
|---|---|---|
| 8,918,050 B2 | 12/2014 | Gormley et al. |
| 2007/0018674 A1 | 1/2007 | Cho et al. |
| 2007/0139167 A1 | 6/2007 | Gilson et al. |
| 2011/0118030 A1 | 5/2011 | Walley et al. |
| 2014/0249397 A1 | 9/2014 | Lake et al. |
| 2015/0088224 A1 | 3/2015 | Goldwasser et al. |
| 2015/0316676 A1 | 11/2015 | Song et al. |
| 2017/0324023 A1* | 11/2017 | Kondoh ................ H01L 41/113 |

OTHER PUBLICATIONS

"Atmospheric Direct Write Material Deposition System", fab.cba.mit.edu/classes/961.04/projects/RegXuProj/MasProject.htm, 2004, 4 pages.
"Conditions for corona discharges", Mar. 8, 2013, 1 page.
"Corona discharge", Wikipedia, Aug. 13, 2017, 8 pages.
Gierad Laput et al., "EM-Sense: Touch Recognition of Uninstrumented, Electrical and Electromechanical Objects", UIST15, Nov. 8-11, 2015, 10 pages.
"Field mill", Wikipedia, May 20, 2015, 2 pages.
"Low frequency", Wikipedia, Jul. 31, 2017, 4 pages.
"Measurement of Static Electric and Magnetic Fields", 2003, 3 pages.
Karen Simonyan et al., "Very Deep Convolutional Networks for Large-Scale Image Recognition", 2014, 14 pages.
Joseph Redmon et al., "You Only Look Once: Unified, Real-Time Object Detection", 2016, 10 pages.

* cited by examiner

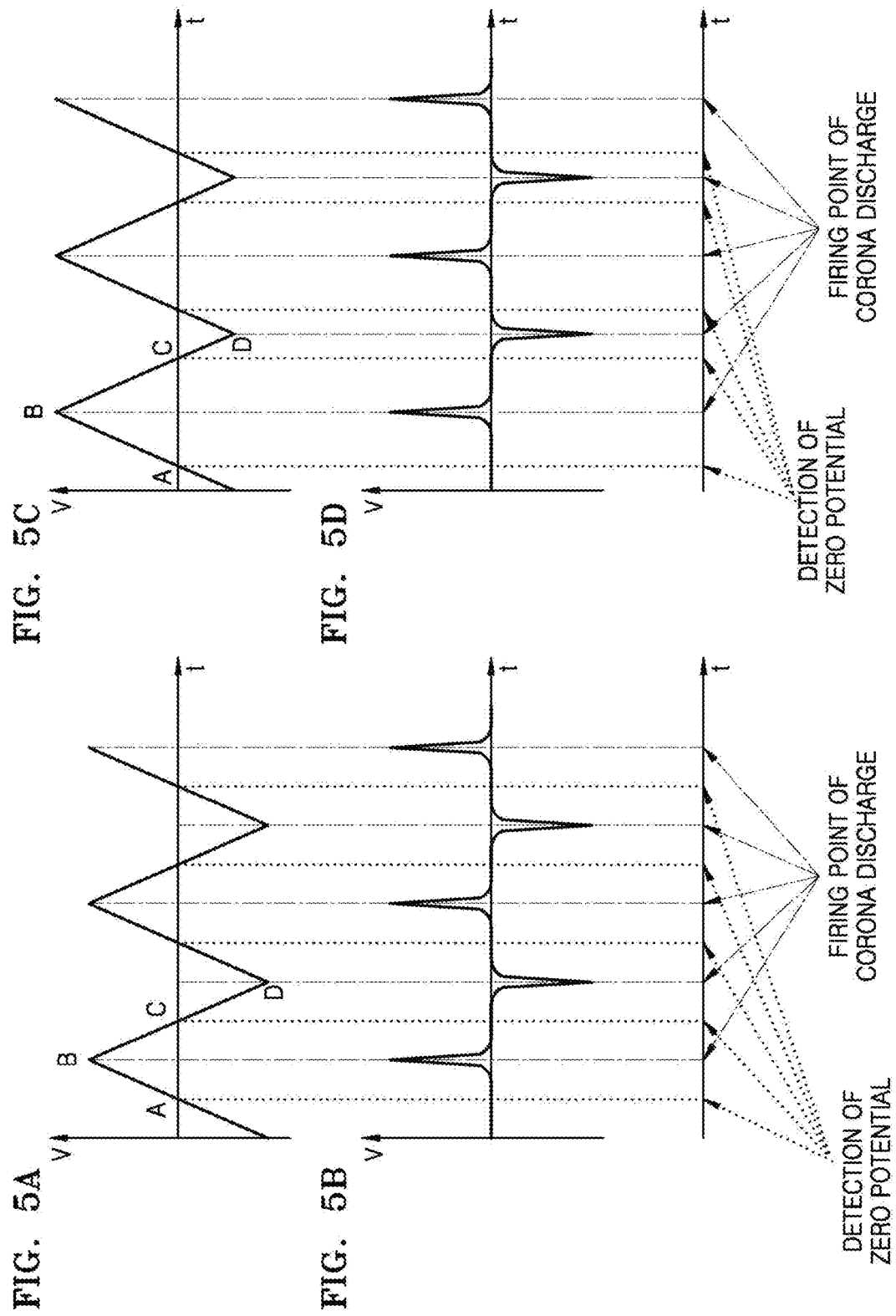

WEARABLE DEVICE AND METHOD OF OPERATING THE SAME

CROSS-REFERENCE TO RELATED APPLICATION

This application is related to and claims priority to Korean Patent Application No. 10-2016-0118299, filed on Sep. 13, 2016, the disclosure of which is incorporated herein in its entirety by reference.

BACKGROUND

The present disclosure relates to a wearable device and a method of operating the same.

With developments in technology related to wearable devices, various types of wearable devices have been recently released to the market, and accordingly, techniques for utilizing the wearable devices are also being developed. Attention has been recently paid to human-computer interaction (HCI)-related technology that enables a user to more easily and conveniently interact with various wearable apparatuses, in other words, enables a user to more conveniently use wearable apparatuses. In particular, interest in a technique of sensing a user's touch of a thing or a person with a part of the user's body wearing a wearable device is increasing.

Examples of such an HCI in wearable apparatuses may include a case where both apparatuses have interfaces for HCI, such as, a touch between wearable apparatuses and a touch between a wearable apparatus and a device having an interface for contacting the wearable apparatus. When a thing that a user desires to touch has no HCI interfaces, the thing is unable to be recognized, and furthermore, it is impossible to recognize another person.

Although a technique of recognizing another thing by using only an interface for HCI built in a wearable apparatus has been proposed, a complicated and inconvenient additional structure, for example, a sensor, is needed to implement this technique. In many cases, there are specific limitations, such as, the impossibility of recognizing another person.

SUMMARY

To address the above-discussed deficiencies, it is a primary object to provide a wearable device capable of sensing an object touched by a user by using corona discharge, and a method of operating the wearable device.

Additional aspects will be set forth in part in the description which follows and, in part, will be apparent from the description, or may be learned by practice of the presented embodiments.

According to an aspect of an embodiment, a wearable device includes a first electrode configured to contact a user's body; a second electrode having a pointed shape, in which corona discharge occurs; a power supplier connected between the first electrode and the second electrode to apply power to the first electrode and the second electrode; a current measurer configured to measure a leakage current that leaks to the second electrode; and a controller configured to control the power supplier to apply power to the first electrode and the second electrode to induce the corona discharge, measure a leakage current generated due to the corona discharge via the current measurer, and sense the touch event, based on the measured leakage current.

According to an aspect of another embodiment, a method of operating a wearable device includes applying power to a first electrode and a second electrode to induce corona discharge; measuring a leakage current generated due to the corona discharge, when the corona discharge occurs; and sensing a touch event, based on the measured leakage current.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIGS. 5A, 5B, 5C and 5D are timing diagrams of parameters of the wearable device according to an embodiment that are compared when a user's body has different potentials;

DETAILED DESCRIPTION

FIGS. 1A through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Various embodiments now will be described more fully hereinafter with reference to the accompanying drawings. The embodiments described hereinafter may be modified in many different forms. To more clearly describe features of embodiments, matters well known to one of ordinary skill in the art to which the below embodiments pertain will not be described in detail.

Throughout the specification, when an element is referred to as being "connected" or "coupled" to another element, it can be directly connected or coupled to the other element, or can be connected or coupled to the other element with intervening elements interposed there between. In addition, the terms "comprises" and/or "comprising" or "includes" and/or "including" when used in this specification, specify the presence of stated elements, but do not preclude the presence or addition of one or more other elements.

Figure 1A:
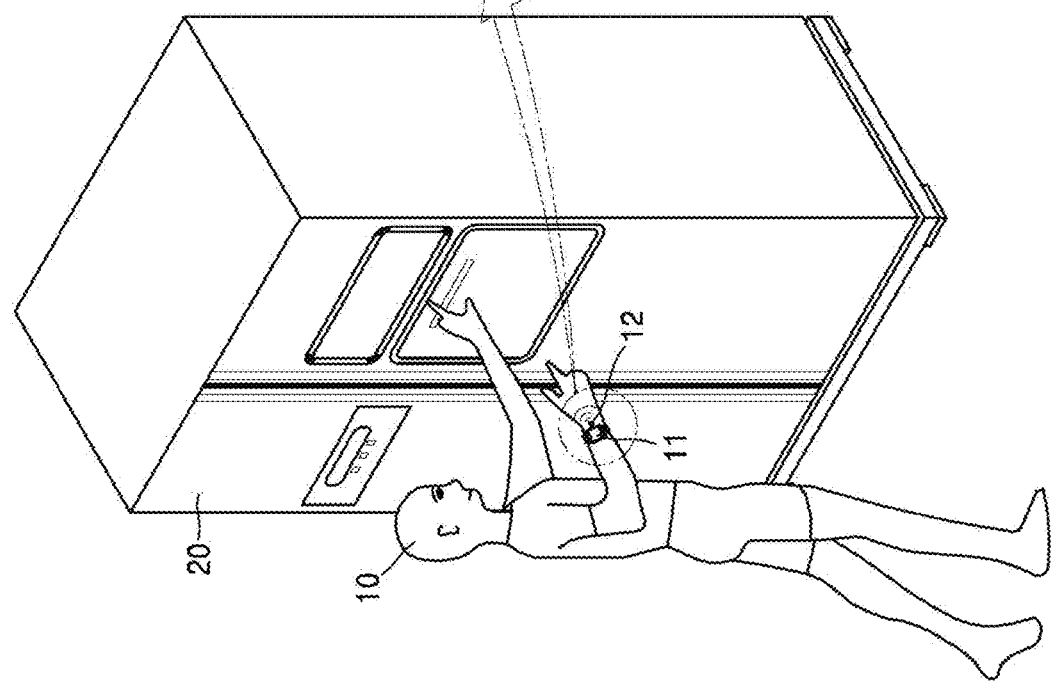
FIGS. 1A and 1B are schematic diagrams illustrating examples of a wearable device according to an embodiment.
Figure 1B:
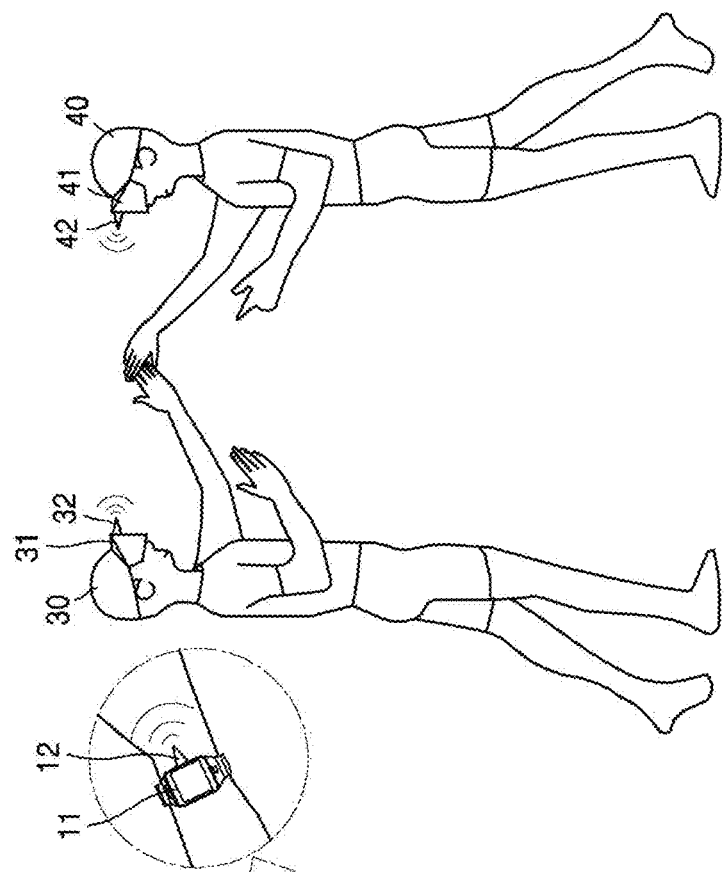

FIGS. 1A and 1B are schematic diagrams illustrating examples of a wearable device according to an embodiment.

Referring to FIG. 1A, a wearable device 11 according to an embodiment may be a smart watch, or may be another device wearable on a wrist, similar to a smart watch. For example, the wearable device 11 may be a smart band. The wearable device 11 includes a pointed-shape electrode 12 for corona discharge.

According to an embodiment, when a body part of a user 10 who wears the wearable device 11 touches an object such as a refrigerator 20, in particular, a conductive object, the wearable device 11 may sense that a touch event in which the body part of the user touches the object has occurred. Furthermore, the wearable device 11 may identify the object touched by the user, via a pre-learning process or by using stored data.

Referring to FIG. 1B, wearable devices 31 and 41 according to an embodiment may be head-mounted displays (HMDs), or may be other devices wearable on the head, similar to HMDs. For example, the wearable devices 31 and 41 may be virtual reality (VR) helmets. Each of the wearable devices 31 and 41 includes the pointed-shape electrode 12 for corona discharge.

According to an embodiment, when a body part of a user 30 who wears the wearable device 31 touches another person 40, the wearable device 31 may sense that a touch event in which the body part of the user 30 touches the other person 40 has occurred. Furthermore, the wearable device 31 may identify who the other person 40 is, via a pre-learning process or by using stored data.

While the other person 40 is wearing the wearable device 41 according to an embodiment, the wearable device 31 may interact with the wearable device 41. For example, the wearable device 31 may sense the touch event and identify the other person 40 and/or the wearable device 41 worn by the other person 40, and may transmit or receive data to or from the wearable device 41 via wireless communication or support the user 30 and the other person 40 to play a game together.

The wearable devices 31 and 41 of FIG. 1B are only different from the wearable device 11 of FIG. 1A in terms of shape, and may perform the same function as the wearable device 11 of FIG. 1A.

A wearable device according to an embodiment and a method of operating the same will now be described in more detail.

Figure 2:
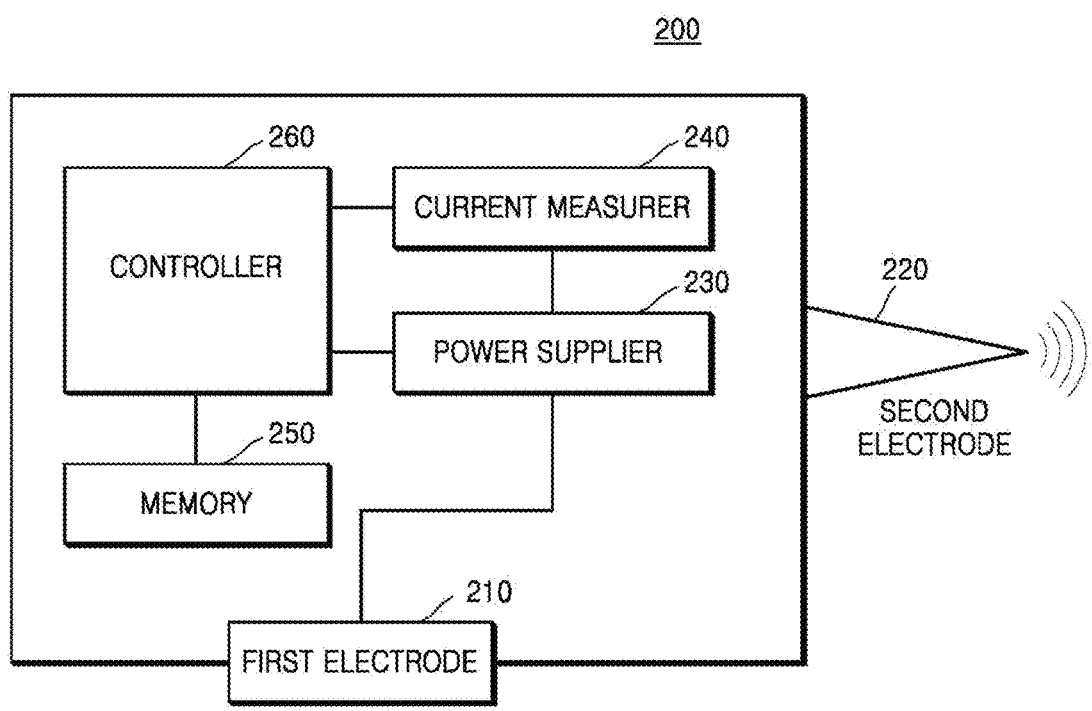
FIG. 2 is a block diagram of an internal structure of a wearable device according to an embodiment.

FIG. 2 is a block diagram of an internal structure of a wearable device 200 according to an embodiment.

Referring to FIG. 2, the wearable device 200 may include a first electrode 210, a second electrode 220, a power supplier 230, a current measurer 240, a memory 250, and a controller 260.

The first electrode 210 contacts the body of a user. According to an embodiment, the wearable device 200 may form an electrical connection with the body of the user by using the first electrode 210. In more detail, via the first electrode 210, a leakage current due to corona discharge flows from the wearable device 200 to the user or from the user to the wearable device 200.

According to an embodiment, the first electrode 210 may be formed of a conductive rubber, because the first electrode 210 contacts the body of a user.

The second electrode 220 has a pointed shape, and corona discharge occurs in the second electrode 220. Because corona discharge occurs around where an electric field concentrates, the second electrode 220 is formed to have a pointed shape for corona discharge. According to an embodiment, the second electrode 220 may have a pointed shape, such as a cone or a needle. According to an embodiment, the leakage current generated due to corona discharge in the second electrode 220 may constitute a closed circuit by using ambient air.

According to an embodiment, the second electrode 220 may be formed of a soft material considering safety, because the second electrode 220 has a pointed shape.

The power supplier 230 is connected between the first electrode 210 and the second electrode 220 and applies power. According to an embodiment, the power supplier 230 applies power to the first electrode 210 and the second electrode 220 in order to induce corona discharge. In more detail, power is applied in a direction in which potential between the first electrode 220 and the second electrode 220 increases. According to an embodiment, the power supplier 230 may be an alternating current (AC) power source or a direct current (DC) power source.

The current measurer 240 is connected to the second electrode 220 and measures a leakage current that leaks to the second electrode 220. According to an embodiment, when corona discharge occurs in the second electrode 220, a leakage current flows via the second electrode 220, and the current measurer 240 measures the leakage current. According to an embodiment, the current measurer 240 may include an ammeter.

The memory 250 may install and store programs, such as applications, and various types of data, such as files. The controller 260 may access and use data stored in the memory 250 or may store new data in the memory 250. The controller 260 may execute a program installed in the memory 250.

According to an embodiment, the memory 250 may store a program and data for sensing a touch event.

The controller 260 may control all operations of the wearable device 200, in particular, a process of recognizing an object touched by a user by using the wearable device 200. The controller 260 may include random-access memory (RAM) that stores a signal or data input by an external source of the wearable device 200 or is used as a memory area for various operations performed by the wearable device 200, read-only memory (ROM) that stores a control program for controlling peripherals, and a processor. The processor may be implemented by using a System On Chip (SoC) into which a core and a graphics processing unit (GPU) are incorporated. The processor may include a plurality of processors.

According to an embodiment, the controller 260 controls the power supplier 230 to apply power to the first electrode 210 and the second electrode 220 in order to induce corona discharge, measures a leakage current due to corona discharge via the current measurer 240, and senses a touch event, based on the measured leakage current. The controller 260 may determine that the potential of the user's body has changed, by sensing a variation in the leakage current. When the potential of the user's body has changed, the controller 260 may determine that a touch event has occurred.

According to an embodiment, when the controller 260 controls the power supplier 230 to apply power to the first electrode 210 and the second electrode 220 and power equal to or greater than a threshold value for corona discharge is supplied, corona discharge occurs in the second electrode 220. When corona discharge occurs, a leakage current is generated via ambient air, and the leakage current flows into a single closed circuit including the ambient air, the ground, and the user's body. According to an embodiment, the controller 260 may measure and monitor the leakage current flowing along the closed circuit and sense a variation in the leakage current.

When a part of the user's body touches a conductive object, the potential of the user's body changes. In more detail, the potential of the user's body is changed to be equal to potential of the conductive object in contact with the user's body. Thus, when the user's body's potential changes, the wearable device 200 according to an embodiment may sense that a touch event has occurred. When the body potential of the user is changed, the magnitude of the leakage current is changed. Thus, when the leakage current is changed, the wearable device 200 according to an embodiment may determine that the potential of the user's body has changed. According to an embodiment, the wearable device 200 according to an embodiment may determine whether the potential of the user's body has changed, by using the leakage current, and accordingly, may determine whether a touch event has occurred. This will now be described in more detail with reference to FIGS. 3-6.

Figure 3:
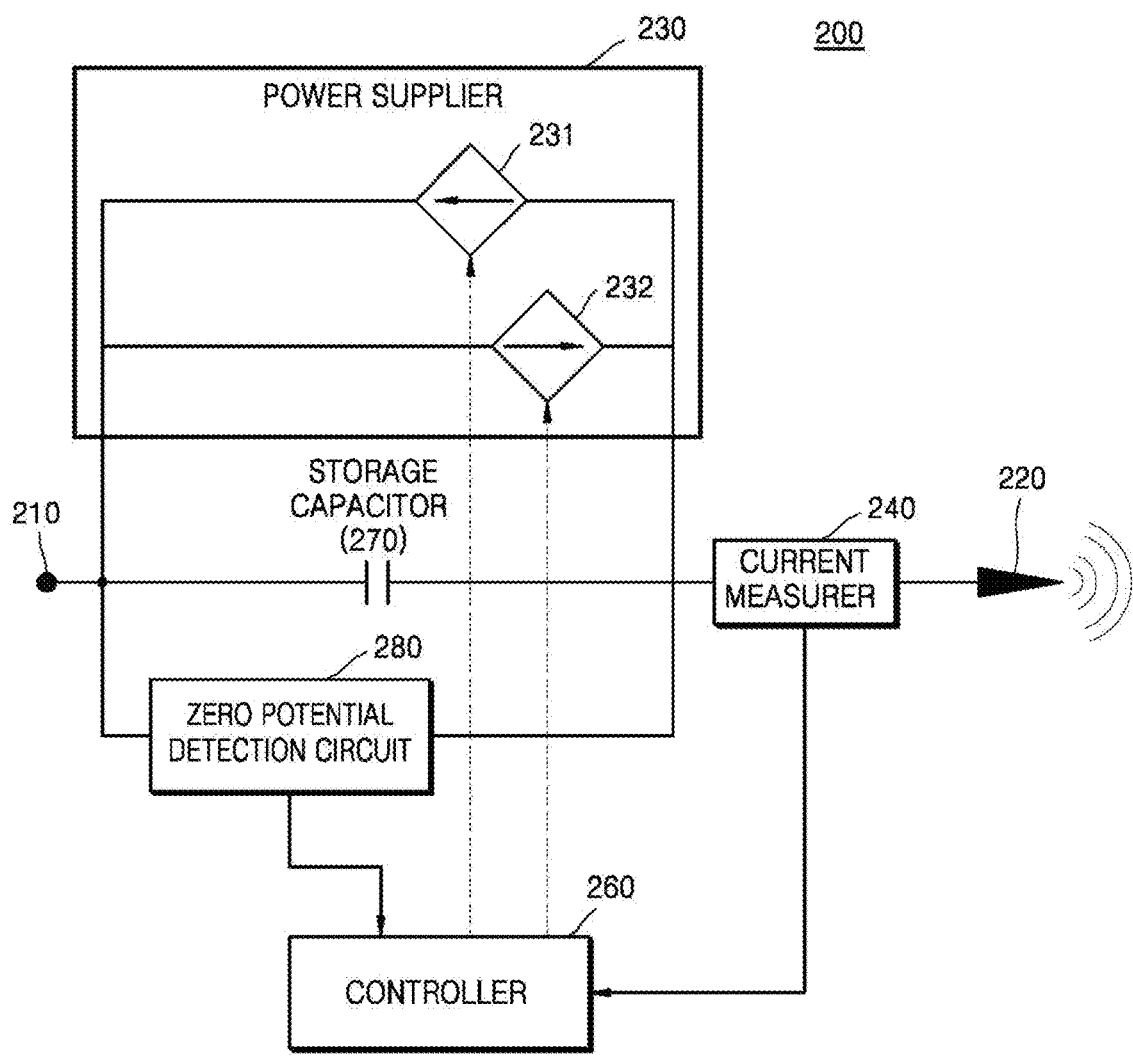
FIG. 3 is a block diagram illustrating the wearable device according to an embodiment in greater detail.

FIG. 3 is a block diagram illustrating the wearable device 200 according to an embodiment in greater detail. Overlapping descriptions between FIGS. 2 and 3 are omitted.

Referring to FIG. 3, the wearable device 200 may further include a storage capacitor 270 and a zero potential detection circuit 280.

The storage capacitor 270 is connected between the first electrode 210 and the second electrode 220 and stores the power applied by the power supplier 230. The polarity of the storage capacitor 270 may depend on the polarity of the power supplied by the power supplier 230.

The zero potential detection circuit 280 may be connected to the storage capacitor 270 in parallel and may detect a point where the polarity of a voltage applied to the storage capacitor 270 changes from a positive value (+) to a negative value (−) or from a negative value (−) to a positive value (+).

According to an embodiment, the power supplier 230 supplies AC power and turns on one of a positive current source 232 and a negative current source 231 under the control of the controller 260. In one version, the positive current source 232 and the negative current source 231 do not operate simultaneously, and only one of them operates at a time. For example, when the positive current source 232 is turned on, the storage capacitor 270 is charged with a positive voltage, and a potential of the second electrode 220 connected to the storage capacitor 270 is increased. An operation of the wearable device 200 will now be described in more detail with reference to FIGS. 4A-4D.

FIGS. 4A-4D are timing diagrams of parameters of the wearable device 200 according to an embodiment.

Figure 4A:
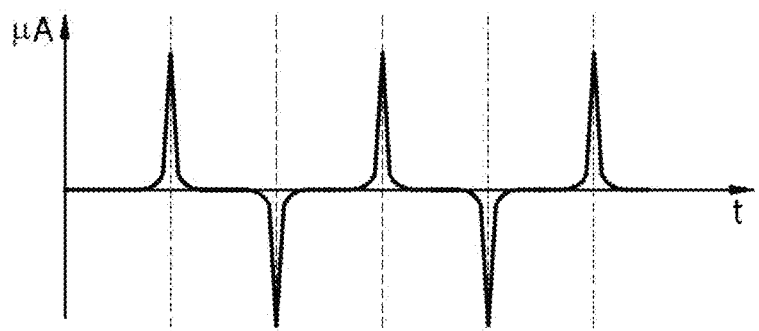
FIGS. 4A, 4B, 4C and 4D are timing diagrams of parameters of the wearable device according to an embodiment.
Figure 4B:
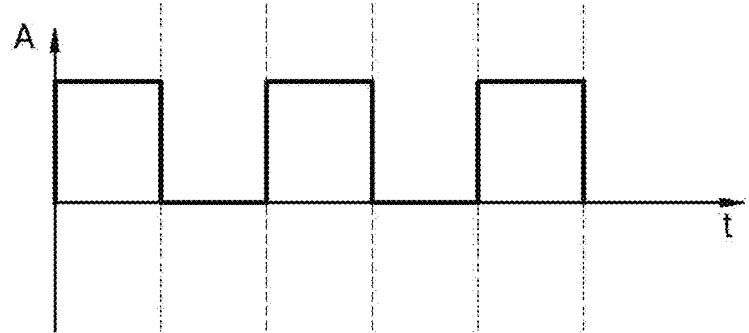
Figure 4C:
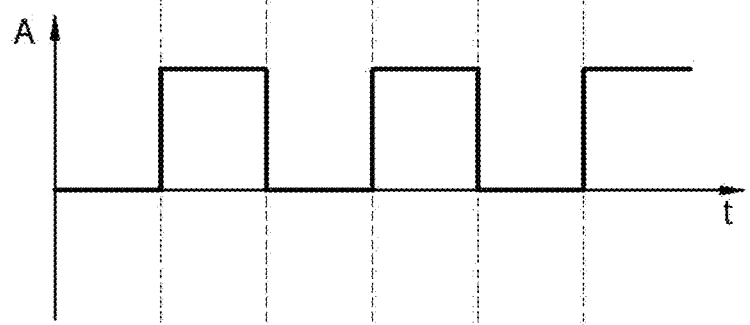
Figure 4D:
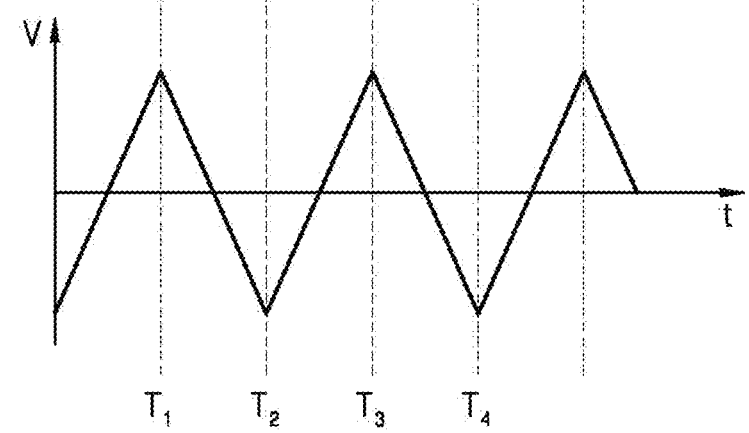

FIG. 4A illustrates a current measured by the current measurer 240. FIG. 4B illustrates an operation of the positive current source 232, and FIG. 4C illustrates an operation of the negative current source 231. It may be seen that, as described above, the positive current source 232 and the negative current source 231 do not operate simultaneously. FIG. 4D illustrates a voltage of the second electrode 220. FIGS. 4A-4D are timing diagrams when the potential of the user's body is zero.

Referring to FIGS. 4A-4D, when the voltage of the second electrode 220 is increased as the positive current source 232 is applied, and, when the voltage of the second electrode 220 increases to a threshold value for corona discharge or greater at a time point $T_1$, positive corona discharge occurs in the second electrode 220, and at the same time a leakage current flows via the ambient air.

According to an embodiment, the controller 260 monitors the leakage current via the current measurer 240 and determines whether the leakage current is changed to at least a preset value (i.e., greater than or equal to a preset value). When the leakage current is changed to the preset value or greater, the controller 260 may determine that the moment when the leakage current is changed to the preset value or greater is a firing point of corona discharge. Accordingly, the controller 260 may determine that the time point $T_1$ when the leakage current is generated due to corona discharge is the firing point of corona discharge. According to an embodiment, the controller 260 may control the power supplier 230 to change the polarity of power applied to the first and second electrodes 210 and 220, based on the firing point of corona discharge.

According to an embodiment, the controller 260 controls the power supplier 230 to change the polarity of power applied to the first and second electrodes 210 and 220, based on the time point $T_1$, being the firing point of corona discharge, and thus, at the time point $T_1$, the positive current source 232 is turned off and the negative current source 231 is turned on. As the negative current source 231 is turned on, the voltage of the second electrode 220 decreases, and then its polarity changes from a positive value (+) to a negative value (−) at one time point after the time point $T_1$.

According to an embodiment, the controller 260 may detect the time point when the polarity of the second electrode 220 changes from a positive value (+) to a negative value (−), via the zero potential detection circuit 280.

According to an embodiment, when the negative current source 231 is continuously applied to the second electrode 220, the voltage of the second electrode 220 continuously decreases. When the voltage of the second electrode 220 decreases to a threshold value for corona discharge or greater at a time point $T_2$, negative corona discharge occurs in the second electrode 220, and at the same time a leakage current flows via the ambient air. Referring to FIGS. 4A-4D, this process is repeated.

Because the potential of the user's body is maintained without change until a touch event in which the user's body touches another object occurs, the leakage current due to corona discharge is also maintained without changes.

The potential of the user's body, the potential of the storage capacitor 270 (or the power supplier 230), and a firing point voltage of corona discharge form the following relationship. Because the first electrode 210 contacts the user's body, the first electrode 210 has the same potential as that of the user's body. Because the storage capacitor 270 is connected between the first electrode 210 and the second electrode 220, the potential of the second electrode 220 has a value obtained by adding the potential of the storage capacitor 270 to that of the first electrode 210. Accordingly, the voltage of the firing point of corona discharge has a value obtained by adding a potential of the storage capacitor 270 at the moment when corona discharge has occurred to the potential of the user's body. An operation of the wearable device 200 when the potential of the user's body is not zero will now be described with reference to FIGS. 5A-5D.

FIGS. 5A-5D are timing diagrams of parameters of a wearable device according to an embodiment that are compared when the user's body has different potentials.

FIGS. 5A and 5B are timing diagrams of parameters of the wearable device 200 when the potential of the user's body is zero as described above with reference to FIGS. 4A-4D, and FIGS. 5C and 5D are timing diagrams of parameters of the wearable device 200 when the potential of the user's body is negative.

FIGS. 5A and 5C illustrate voltages of the storage capacitor 270. In FIG. 5A, because the potential of the user's body is 0, the voltage of the storage capacitor 270 is the same as that of the second electrode 220. However, in FIG. 5C, because the potential of the user's body is negative, the voltage of the storage capacitor 270 is not identical with that of the second electrode 220, and thus the voltage of the storage capacitor 270 is shown. FIGS. 5B and 5D illustrate currents measured by the current measurer 240.

When FIGS. 5A and 5B are compared with FIGS. 5C and 5D, there is a difference in a time point when zero potential is generated. When the potential of the user's body is negative, more power needs to be supplied to reach the same potential, than when the potential of the user is zero. Accordingly, when the potential of the user's body is negative, more time is taken to supply power from a zero potential to a voltage that enables positive corona discharge to occur, than when the potential of the user is zero. On the other hand, because the potential of the user's body is negative, less time is taken to supply negative power from zero potential to a voltage that enables negative corona discharge to occur, than when the potential of the user is zero.

It may be seen that a time period between a time point A, being a zero potential point, and a time point B when positive corona discharge occurs in FIGS. 5C and 5D is longer than a time period between the time point A, being the zero potential point, and the time point B when positive corona discharge occurs in FIGS. 5A and 5B. It may also be seen that a time period between a time point C, being a zero potential point, and a time point D when negative corona discharge occurs in FIGS. 5C and 5D is shorter than a time period between the time point C, being the zero potential point, and the time point D when negative corona discharge occurs in FIGS. 5A and 5B.

In other words, according to an embodiment, a time period during which the storage capacitor 270 is charged with a positive voltage or a time period during which the storage capacitor 270 is charged with a negative voltage varies according to different potentials of the user's body. This will now be described in detail with reference to FIGS. 6A-6E.

FIGS. 6A-6E are timing diagrams illustrating application of positive power according to different user potentials, according to an embodiment.

In FIGS. 6A-6E, T refers to a time period during which positive power is being applied to the storage capacitor 270, and $T_0$ refers to a time interval between firing points of corona discharge.

Figure 6A:
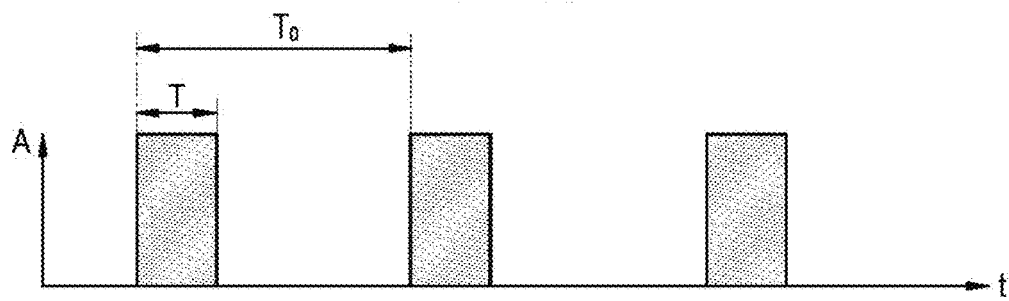
FIGS. 6A, 6B, 6C, 6D and 6E are timing diagrams illustrating application of positive power according to different user potentials, according to an embodiment.
Figure 6B:
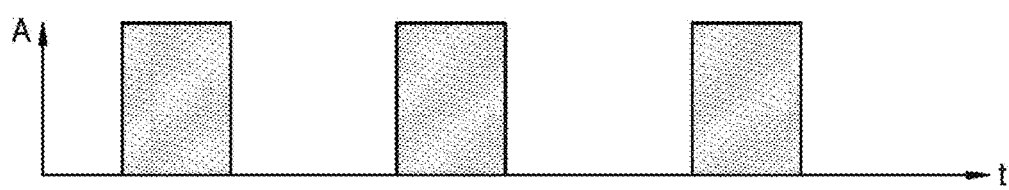
Figure 6C:
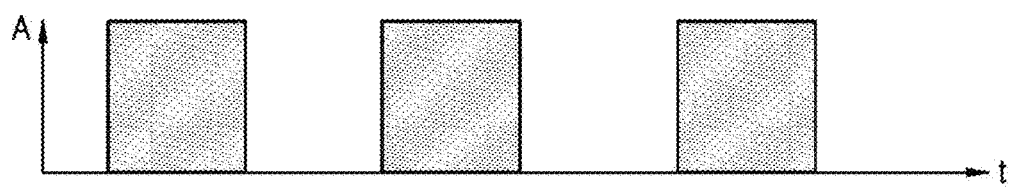

FIG. 6C is a timing diagram of a time period during which positive power is being applied to the storage capacitor 270, when the potential of the user's body is zero. Compared with FIG. 6C, FIGS. 6A and 6B are timing diagrams of time periods during which positive power is being applied to the storage capacitor 270, when the potential of the user's body is positive. The potential of the user's body in FIG. 6A is greater than that in FIG. 6B. As the user's body has a higher amount of potential, the time period during which positive power is being applied may decrease.

Figure 6D:
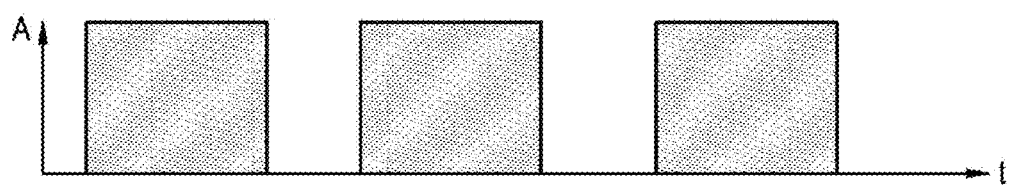
Figure 6E:
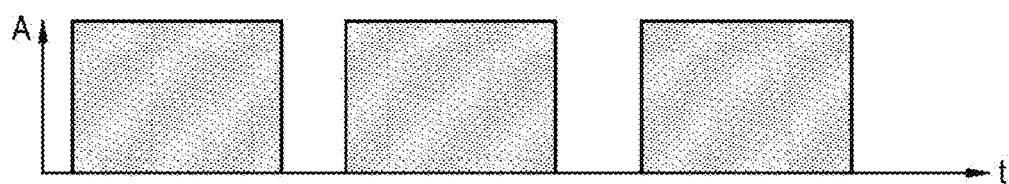

FIGS. 6D and 6E are timing diagrams of time periods during which positive power is being applied to the storage capacitor 270, when the potential of the user's body is negative. The potential of the user's body in FIG. 6E is lower than that in FIG. 6D. As the user's body has a lower amount of negative potential, the time period during which positive power is being applied may increase.

The description of FIG. 3 will now be referred to again.

As described above, the time point when the polarity of the second electrode 220 changes from a positive value (+) to a negative value (−) may vary according to different potentials of the user's body.

According to an embodiment, by using this point, the potential of the user's body may be calculated based on a time interval between the firing points of corona discharge, a time period during which the storage capacitor 270 is charged with a positive voltage or a negative voltage, a firing voltage of positive corona discharge, and a firing voltage of negative corona discharge.

In more detail, according to an embodiment, the controller 260 may calculate the potential of the user's body by using Equation 1.

$$U_{user} = \frac{T}{T_0} U_P = \frac{(T_0 - T)}{T_0} U_N \qquad \text{Equation 1}$$

Uuser: the potential of a user's body
T: a time interval between firing points of corona discharge
$T_0$: a time period during which a storage capacitor is charged with a positive voltage
$U_P$: a firing voltage of positive corona discharge
$U_N$: a firing voltage of negative corona discharge The time interval T between the firing points of corona discharge may be known from the leakage current measured by the current measurer 240, and the time period $T_O$ during which the storage capacitor 270 is charged with the positive voltage may be known from the time point when the polarity of the second electrode 220 changes, which is detected by the zero potential detection circuit 280. The firing voltage $U_P$ of positive corona discharge and the firing voltage $U_N$ of negative corona discharge may be determined according to surrounding environments.

According to an embodiment, the controller 260 may calculate the potential of the user's body, and, when the potential of the user's body has changed, the controller 260 may determine that a touch event has occurred.

Figure 7A:
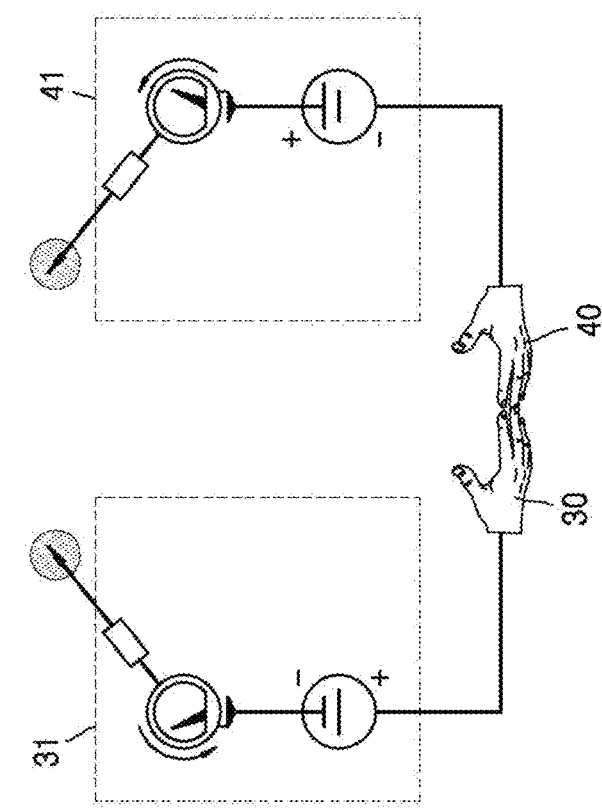
FIGS. 7A and 7B are diagrams illustrating variations in potential of a user after a touch event occurs, according to an embodiment.
Figure 7B:
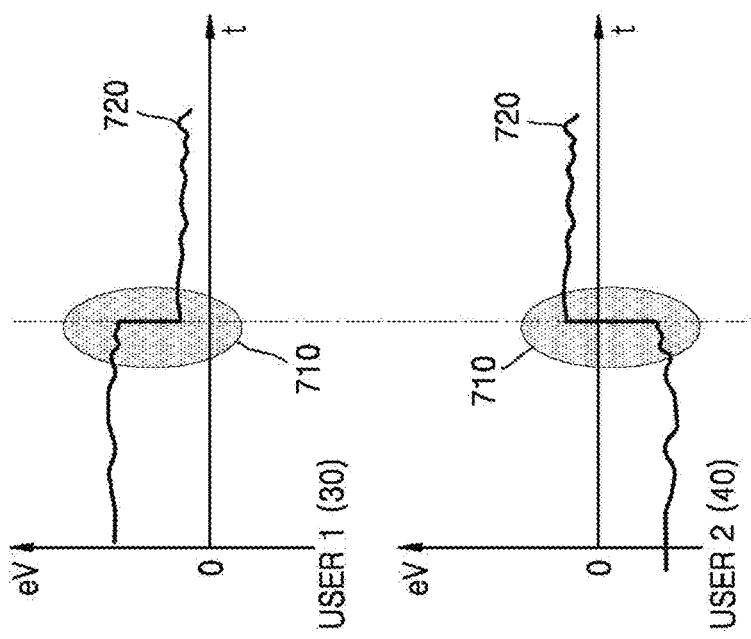

FIGS. 7A and 7B are diagrams illustrating variations in the potential of a user after a touch event occurs.

Referring to FIGS. 7A and 7B, the user 30 who wears the wearable device 31 has a positive potential, and the user 40 who wears the wearable device 41 has a negative potential. This is merely an example, and embodiments are not limited thereto. For example, both the user 30 and the user 40 may have positive potentials. In addition, not only a touch event between users is possible, but an embodiment in which a user touches a conductive object also is possible.

When the two users 30 and 40 shake hands with each other (as indicated by reference numeral 710), the two users 30 and 40 are electrically connected to each other, and thus have the same potential 720. At this time, the potentials of the two users 30 and 40 change, and thus leakage currents respectively generated during corona discharge in the wearable devices 31 and 41 also change. Accordingly, each of the wearable devices 31 and 41 may measure the leakage current, sense a variation in the leakage current, determine that the potential of the user's body has changed, and determine that a touch event has occurred.

The description of FIG. 2 will now be referred to again.

According to an embodiment, the controller 260 may learn a target to which a touch event is to occur according to a leakage current due to corona discharge, and, when the touch event occurs, the controller 260 may identify the target to which the touch event is to occur. When a touch on the same object or person occurs under the same conditions, a variation in the potential of the user is the same, and thus a variation in the leakage current due to corona discharge may be the same. According to an embodiment, the controller 260 may identify the target to which the touch event is to occur, by using this characteristic.

According to an embodiment, when a touch on a specific target occurs, the controller 260 may store a variation in the potential of the user or a variation in the leakage current. Thereafter, when a touch event occurs, the controller 260 may compare a variation in the potential of the user or a variation in the leakage current with the stored data, and identify the target to which the touch event is to occur. According to an embodiment, this learning process may be implemented by artificial intelligence (AI)-based learning, such as machine learning, or may be implemented via a user input. For example, when the same target is touched repeatedly, the controller 260 may secure many pieces of data on the same target and thus increase the accuracy of identification. Alternatively, when the touch event occurs and then the user inputs identification information about the target to which the touch event is to occur, the controller 260 may store the input information, and may identify the target when a touch event occurs later.

According to an embodiment, the wearable device 200 may further include a communicator (not shown). According to an embodiment, the communicator may perform wired/wireless communication with another device or network. To this end, the communicator may include a communication module that supports at least one of various wired/wireless communication methods. According to an embodiment, the communicator may be a wired/wireless communicator. The wired communicator may include at least one module of, for example, wireless fidelity (WiFi), WiFi Direct, Bluetooth, ultra wide band (UWB), and near field communication (NFC). The wired communicator may include at least one module of, for example, a USB and a high definition multimedia interface (HDMI).

According to an embodiment, when the controller 260 senses a touch event, the wearable device 200 may communicate with an external device, being the target to which the touch event is to occur, via the communicator. The wearable device 200 is able to provide various services via this communication with the external device.

According to an embodiment, when the target to which the touch event is to occur is another electronic device, the wearable device 200 may provide a service according to the attributes of the electronic device. For example, when the target to which the touch event is to occur is a home appliance, such as, a washing machine or a microwave, the wearable device 200 may identify the home appliance via a touch event and may be connected to the home appliance via the wearable device 200 to manipulate the home appliance.

According to an embodiment, when the target to which the touch event is to occur is another person and the other person is wearing a wearable device capable of sensing a touch event, the two persons are able to identify each other. By using this point, while playing the same game, the two persons may call characters on the game from each other via a touch event, transmit or receive messages to or from each other, and provide a service, such as, watching the same moving picture together. Furthermore, it is possible to make a payment or provide a data sharing service by using a touch event as an authenticating means.

The structure of the wearable device 200 has been described above. A method of operating the wearable device 200 will now be described. Matters which are the same as those of the wearable device 200 will be briefly described.

Figure 8:
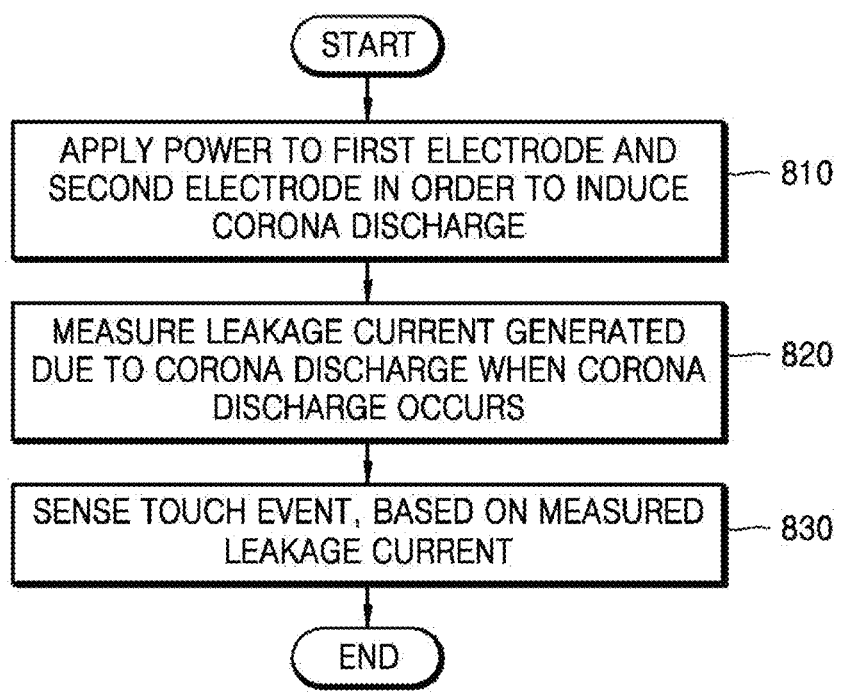
FIG. 8 is a flowchart of a method of operating a wearable device, according to an embodiment.

FIG. 8 is a flowchart of a method of operating the wearable device 200, according to an embodiment.

In operation 810, the wearable device 200 applies power to the first electrode 210 and the second electrode 220 in order to induce corona discharge. According to an embodiment, the wearable device 200 may apply AC power to the first electrode 210 and the second electrode 220.

Thereafter, in operation 820, when corona discharge occurs, the wearable device 200 measures a leakage current generated due to the corona discharge.

In operation 830, the wearable device 200 senses a touch event, based on the measured leakage current. According to an embodiment, when the wearable device 200 senses a touch event, the wearable device 200 may sense a variation in the leakage current and may determine that the potential of the user's body has changed. When the potential of the user's body has changed, the wearable device 200 may determine that a touch event has occurred. At this time, the wearable device 200 may measure the time interval between the firing points of the corona discharge, based on the leakage current, may measure the time period during which the storage capacitor 270 is charged with a positive voltage or a negative voltage, by using the zero potential detection circuit, and may calculate the potential of the user's body, based on the measured time interval between the firing points of the corona discharge, the measured time period during which the storage capacitor 270 is charged with a positive voltage or a negative voltage, the firing voltage of positive corona discharge, and the firing voltage of negative corona discharge.

According to an embodiment, the wearable device 200 may calculate the potential of the user's body by using Equation 1.

$$U_{user} = \frac{T}{T_0}U_P = \frac{(T_0-T)}{T_0}U_N \qquad \text{Equation 1}$$

Uuser: the potential of a user's body
T: the time interval between the firing points of corona discharge
$T_0$: a time period during which a storage capacitor is charged with a positive voltage
$U_P$: a firing voltage of positive corona discharge
$U_N$: a firing voltage of negative corona discharge The time interval T between the firing points of corona discharge may be known from the leakage current measured by the current measurer 240, and the time period $T_0$ during which the storage capacitor 270 is charged with the positive voltage may be known from the time point when the polarity of the second electrode 220 changes, which is detected by the zero potential detection circuit 280. The firing voltage $U_P$ of positive corona discharge and the firing voltage $U_N$ of negative corona discharge may be determined according to surrounding environments.

According to an embodiment, when the wearable device 200 senses a variation in the leakage current and thus determines that the potential of the user's body has changed, the wearable device 200 may change the polarity of power applied to the first electrode 210 and the second electrode 220, based on a firing point of corona discharge. At this time, the wearable device 200 monitors the leakage current via the current measurer 240 and determines whether the leakage current changes to a preset value or greater. When the leakage current changes to the preset value or greater, the wearable device 200 may determine that the moment when the leakage current changes to the preset value or greater is the firing point of corona discharge.

According to an embodiment, the wearable device 200 may learn a target to which the touch event is to occur according to a leakage current due to corona discharge, and, when the touch event occurs, the wearable device 200 may identify the target to which the touch event is to occur.

According to an embodiment, when the wearable device 200 senses a touch event, the wearable device 200 may communicate with an external device, being the target to which the touch event is to occur.

The above-described embodiments may be embodied as a computer-readable recording medium for storing computer executable command languages and data. At least one of the command languages and data may be stored as program code and, when executed by a processor, may perform a certain operation by generating a certain program module.

The computer-readable recording medium may refer to a magnetic storage medium (e.g., a hard disk) and an optical recording medium (e.g., a CD or a DVD), and may refer to memory included in a server accessible via a network. For example, the computer-readable recording medium may be a memory of an HDM, or may be a memory included in a terminal, a server, or the like connected to an HDM via a network.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A wearable device comprising:
a first electrode configured to contact a user's body;
a second electrode having a pointed shape, in which corona discharge occurs;
a power supplier connected between the first electrode and the second electrode to apply power to the first electrode and the second electrode;
a current measurer configured to measure a leakage current that leaks to the second electrode;
a memory configured to store a program for sensing a touch event; and
a controller configured to control the power supplier to apply power to the first electrode and the second electrode to induce the corona discharge, measure the leakage current generated due to the corona discharge via the current measurer, and sense the touch event, based on the measured leakage current.

2. The wearable device of claim 1, wherein the controller is configured to determine that potential of the user's body has changed, by sensing a variation in the leakage current, and, when the potential of the user's body has changed, determine that the touch event has occurred.

3. The wearable device of claim 2, further comprising a storage capacitor between the first electrode and the second electrode and a zero potential detection circuit connected to the storage capacitor in parallel, wherein
the power supplier supplies alternating current (AC) power, and
the controller is configured to:
measure a time interval between firing points of the corona discharge, based on the leakage current,
measure a time period during which the storage capacitor is charged with a positive voltage or a time period during which the storage capacitor is charged with a negative voltage, by using the zero potential detection circuit, and
calculate the potential of the user's body, based on the time interval between the firing points of corona discharge, the time period during which the storage capacitor is charged with a positive voltage or a negative voltage, a firing voltage of positive corona discharge, and a firing voltage of negative corona discharge.

4. The wearable device of claim 3, wherein the controller calculates the potential of the user's body by using Equation 1

$$U_{user} = \frac{T}{T_0}U_P = \frac{(T_0-T)}{T_0}U_N \qquad \text{Equation 1}$$

$U_{user}$: the potential of the user's body
T: the time interval between the firing points of corona discharge
$T_0$: the time period during which the storage capacitor is charged with the positive voltage
$U_P$: the firing voltage of positive corona discharge
$U_N$: the firing voltage of negative corona discharge.

5. The wearable device of claim 3, wherein the controller is configured to control the power supplier to change a polarity of power applied to the first electrode and the second electrode, based on one of the firing points of the corona discharge.

6. The wearable device of claim 5, wherein the controller is configured to monitor the leakage current via the current measurer and determine whether the leakage current changes to at least a preset value, and, when the leakage current changes to at least the preset value, the controller is configured to determine that a moment when the leakage current changes to at least the preset value is said one of the firing points of the corona discharge.

7. The wearable device of claim 1, wherein the controller is configured to:
learn a target to which the touch event is to occur, according to the leakage current generated due to the corona discharge, and
identify the target to which the touch event is to occur, when the touch event occurs.

8. The wearable device of claim 1, further comprising a communicator,
wherein, when the controller senses the touch event, the controller communicates with an external device, which is a target to which the touch event is to occur, via the communicator.

9. A method of operating a wearable device, the method comprising:
applying, by a power source, power to a first electrode and a second electrode to induce corona discharge;
measuring, by a current sensor, a leakage current generated due to the corona discharge, when the corona discharge occurs; and
sensing a touch event, based on the measured leakage current.

10. The method of claim 9, wherein the sensing of the touch event based on the measured leakage current comprises:
sensing a variation in the leakage current and determining that a potential of a user's body has changed; and
when the potential of the user's body has changed, determining that the touch event has occurred.

11. The method of claim 10, wherein
the applying of the power to the first electrode and the second electrode to induce the corona discharge comprises applying alternating current (AC) power, and
the sensing of the variation in the leakage current and the determining that the potential of the user's body has changed comprises:
measuring a time interval between firing points of the corona discharge, based on the leakage current;
measuring a time period during which a storage capacitor, disposed between the first electrode and the second electrode and a zero potential detection circuit, is charged with a positive voltage or a time period during which the storage capacitor is charged with a negative voltage, by using the zero potential detection circuit; and
calculating the potential of the user's body, based on the time interval between the firing points of corona discharge, the time period during which the storage capacitor is charged with a positive voltage or a negative voltage, a firing voltage of positive corona discharge, and a firing voltage of negative corona discharge.

12. The method of claim 11, wherein the calculating of the potential of the user's body comprises calculating the potential of the user's body by using Equation 1

$$U_{user} = \frac{T}{T_0} U_P = \frac{(T_0 - T)}{T_0} U_N \qquad \text{Equation 1}$$

$U_{user}$: the potential of the user's body
T: the time interval between the firing points of corona discharge
$T_0$: the time period during which the storage capacitor is charged with the positive voltage
$U_P$: the firing voltage of positive corona discharge
$U_N$: the firing voltage of negative corona discharge.

13. The method of claim 11, wherein the sensing of the variation in the leakage current and the determining that the potential of the user's body has changed comprises changing a polarity of power applied to the first electrode and the second electrode, based on one of the firing points of the corona discharge.

14. The method of claim 13, wherein the changing of the polarity of power applied to the first electrode and the second electrode, based on the one of the firing points of the corona discharge, comprises:
monitoring the leakage current via a current measurer and determining whether the leakage current changes to at least a preset value; and
when the leakage current changes to at least the preset value, determining that a moment when the leakage current changes to at least the preset value is the one of the firing points of the corona discharge.

15. The method of claim 9, further comprising learning a target to which the touch event is to occur, according to the leakage current generated due to the corona discharge,
wherein the sensing of the touch event based on the measured leakage current further comprises identifying the target to which the touch event is to occur, when the touch event occurs.

16. The method of claim 15, further comprising, when the touch event is sensed, communicating with an external device which is the target to which the touch event is to occur.

* * * * *